United States Patent [19]
Haville et al.

[11] 4,427,972
[45] Jan. 24, 1984

[54] MODULAR SHAFT ENCODER SYSTEM FOR NON-BINARY COUNTS

[75] Inventors: George D. Haville; Paul A. Johnson, both of Santa Barbara, Calif.

[73] Assignee: BEI Electronics, Inc., San Francisco, Calif.

[21] Appl. No.: 314,204

[22] Filed: Oct. 23, 1981

[51] Int. Cl.³ ............................................. H03K 13/00
[52] U.S. Cl. ........................... 340/347 P; 250/231 SE
[58] Field of Search ............... 340/347 P; 250/231 SE

[56] References Cited

U.S. PATENT DOCUMENTS 3,310,801  3/1967  Hood ................................ 340/347 P
3,653,015  3/1972  Rock ............................ 340/347 P X Primary Examiner—C. D. Miller
Attorney, Agent, or Firm—Limbach, Limbach & Sutton

[57] ABSTRACT

An encoder system which provides non-power of two, unambiguous, even counts, the system having a modular configuration to permit a substantial portion of the system to comprise standardized modules, wherein modifications to a minimum of modules provide a wide range of different system counts, the system utilizing a truncated, symmetric, unit step code sequence and a division of processing functions among modules which permits the user to select among system outputs having a number of different processing levels.

29 Claims, 9 Drawing Figures

| DECIMAL | 8 BIT REFLECTED GRAY CODE |||||||||
|---|---|---|---|---|---|---|---|---|---|
| | BIT | 8 | 7 | 6 | 5 | 4 | 3 | 2 | 1 |
| 0 | | 0 | 0 | 0 | 0 | 0 | 0 | 0 | 0 |
| 1 | | 0 | 0 | 0 | 0 | 0 | 0 | 0 | 1 |
| 2 | | 0 | 0 | 0 | 0 | 0 | 0 | 1 | 1 |
| 3 | | 0 | 0 | 0 | 0 | 0 | 0 | 1 | 0 |
| 4 | | 0 | 0 | 0 | 0 | 0 | 1 | 1 | 0 |
| 5 | | 0 | 0 | 0 | 0 | 0 | 1 | 1 | 1 |
| 6 | | 0 | 0 | 0 | 0 | 0 | 1 | 0 | 1 |
| 7 | | 0 | 0 | 0 | 0 | 0 | 1 | 0 | 0 |
| 8 | | 0 | 0 | 0 | 0 | 1 | 1 | 0 | 0 |
| ⋮ | | ⋮ | ⋮ | ⋮ | ⋮ | ⋮ | ⋮ | ⋮ | ⋮ |
| 120 | | 0 | 1 | 0 | 0 | 0 | 0 | 0 | 0 |
| 121 | | 0 | 1 | 0 | 0 | 0 | 0 | 0 | 1 |
| 122 | | 0 | 1 | 0 | 0 | 0 | 0 | 1 | 1 |
| 123 | | 0 | 1 | 0 | 0 | 0 | 0 | 1 | 0 |
| 124 | | 0 | 1 | 0 | 0 | 0 | 0 | 1 | 0 |
| 125 | | 0 | 1 | 0 | 0 | 0 | 0 | 1 | 1 |
| 126 | | 0 | 1 | 0 | 0 | 0 | 0 | 0 | 1 |
| 127 | | 0 | 1 | 0 | 0 | 0 | 0 | 0 | 0 |
| 128 | | 1 | 1 | 0 | 0 | 0 | 0 | 0 | 0 |
| 129 | | 1 | 1 | 0 | 0 | 0 | 0 | 0 | 1 |
| 130 | | 1 | 1 | 0 | 0 | 0 | 0 | 1 | 1 |
| 131 | | 1 | 1 | 0 | 0 | 0 | 0 | 1 | 0 |
| 132 | | 1 | 1 | 0 | 0 | 0 | 0 | 1 | 0 |
| 133 | | 1 | 1 | 0 | 0 | 0 | 0 | 1 | 1 |
| 134 | | 1 | 1 | 0 | 0 | 0 | 0 | 0 | 1 |
| 135 | | 1 | 1 | 0 | 0 | 0 | 0 | 0 | 0 |
| ⋮ | | ⋮ | ⋮ | ⋮ | ⋮ | ⋮ | ⋮ | ⋮ | ⋮ |
| 248 | | 1 | 0 | 0 | 0 | 0 | 1 | 0 | 0 |
| 249 | | 1 | 0 | 0 | 0 | 0 | 1 | 0 | 1 |
| 250 | | 1 | 0 | 0 | 0 | 0 | 1 | 1 | 1 |
| 251 | | 1 | 0 | 0 | 0 | 0 | 1 | 1 | 0 |
| 252 | | 1 | 0 | 0 | 0 | 0 | 0 | 1 | 0 |
| 253 | | 1 | 0 | 0 | 0 | 0 | 0 | 1 | 1 |
| 254 | | 1 | 0 | 0 | 0 | 0 | 0 | 0 | 1 |
| 255 | | 1 | 0 | 0 | 0 | 0 | 0 | 0 | 0 |

MODULAR SHAFT ENCODER SYSTEM FOR NON-BINARY COUNTS

BACKGROUND OF THE INVENTION

The invention relates generally to position encoders, and, in particular, to a position encoder system which offers unambiguous, non-binary, even counts in a modular framework.

The use of a rotatable code member which provides a coded output indicative of the angular position of the code member is a well-known and often-used technique for determining the position of rotating members. A plurality of tracks having light and dark segments are provided on the code member such that, depending upon the resolution required, any one position of the code member is represented by a unique code word. The code word comprises the portions of the various tracks which fall within the segment of arc on the code member associated with the code member position. Means are provided for detecting the particular code word associated with the code member position for which an indication is desired. Processing is then provided which interprets the code word obtained from the code member and which converts the code word into a form which is processable by the user.

The output format most often provided to the user is a binary-coded decimal format.

The number of counts provided by a particular code member is generally, a function of the number of tracks used. For example, if four tracks are used, the maximum count available $2^4$ or 16. Likewise, if 16 tracks are provided, the maximum count is typically $2^{16}$ or 65,536. When non-binary, i.e., non-power of two counts, are required less than the full complement of code words for the given number of tracks will be used. By non-power of two counts, it is meant a system count which does not equal the quantity two raised to some integer power. Therefore, for example, if a count of 60,000 were desired, a code member having sixteen tracks would be provided which has 60,000 of the possible 65,536 code words from the full code complement.

The situation becomes more complicated when an unambiguous count is desired. In the power of two-count, i.e., binary count, situation, an unambiguous count can be provided through the use of a gray code, or unit step code. With gray codes, only a single bit changes between adjacent words in the code sequence. Therefore, the identity of the code word depends solely upon the value of the bit which changes. In other codes several bits can change. Due to the nature of the track arrangement on the code member these transitions are often not simultaneous. Therefore ambiguities arise when the edges between codes are being scanned by the system.

Where a non-power of two count is desired, use of less than the full complement gray code typically destroys its single bit change per consecutive word characteristic. Therefore, an unambiguous non-binary (or non-power of two) count is not simply obtained.

In the past, non-power of two encoders have been custom-designed depending upon the particular count desired. That is, each encoder had to be designed with electronics unique to the particular encoder thereby providing little flexibility for the addition of options or variations in the output format or system count. This, in turn, dictated a higher cost for each encoder.

As mentioned above, the typical output format provided for a non-binary count encoder was binary-coded decimal. A predominant method of providing a non-binary count in binary coded decimal format is to encode the code member with a binary-coded decimal code. Not only does this approach limit the output format to binary-coded decimal, but also requires that much effort be spent on formulating the binary-coded decimal track arrangement on the code member itself. This approach, typically, does not provide an unambiguous format. Therefore, at the word edges of the code member, ambiguities will arise.

Another approach is to encode the non-power of two count on the code member in a binary-coded-decimal like format, using truncated gray codes. For example, if a count of zero through 359 is desired, a set of tracks is dedicated to providing counts for the one's digit of the count, and another set of tracks is dedicated to providing the hundreds and tens digits of the count. The sets of tracks are scrambled, with much effort, in order to satisfy the one bit change per word rule. As a result of this scrambling, custom electronics are required to descramble the code, with each set of electronics being unique to the particular system. One such system providing a particular non-power of two count is, therefore, fundamentally different from another such system providing a different non-power of two count. However, in all systems implemented in this manner, the unambiguous code word feature is provided.

The present invention provides an encoder system for supplying non-power of two, even counts which can be implemented in modular form and further wherein the distribution of processing functions to particular signal processing modules permits simple and inexpensive modification of the overall system for different non-power of two, even counts. Thus, the present invention provides a basic set of electronic processing circuitry which can be predesigned with minimal consideration of the actual count required. The implementation of different counts can then be performed by modifying certain of the standard modules, preferably a maximum of one or two modules, and the code member.

As an added benefit, the modular configuration of the present invention permits a variety of user processable system outputs. The user can specify the level of processing to be done by the encoder system, thereafter providing his/her own additional processing. This permits the system to be further customized to the particular requirements of a user without the cost of the typical customized encoder system. For example, if the user does not need a binary-coded decimal output, but has the facility to use a natural binary format, the present invention can be simply configured to provide a natural binary output with a minimum of cost. Alternatively, the user may desire an output which is in the encoded format. That is, the system provides the encoded word as detected from the code member. The user then provides the processing for converting the code word into the final position indication. Such an output format is easily provided by the present invention, with a minimum of modification and a minimum of cost.

SUMMARY OF THE INVENTION

The foregoing and other problems of prior art encoder systems are overcome by the present invention of an encoder system which provides unambiguous, non-power of two, even counts, comprising code means having a multiplicity of tracks which are arranged to provide code words in a truncated, symmetric, unit step code sequence and means which are responsive to the truncated code sequence for converting the code sequence into an excess natural format. Means are provided which are responsive to the excess natural format for adjusting each excess natural word into its natural binary format. Means are also provided which are responsive to the natural binary words for converting the natural binary words into a binary-coded decimal format.

The truncated, symmetric, unit step code sequence is formed from a full complement, symmetric, unit step code sequence. The difference between the count of the full complement code sequence and the total number of words removed corresponds to the system count. The amount by which the excess natural words are adjusted to provide the natural binary word is equal to one-half of the number of words removed to form the truncated, symmetric, unit-step code sequence. The system count can be easily modified by changing the track arrangement of the code means and by changing the quantity by which the excess natural word is adjusted. No track scrambling or descrambling is required. The remainder of the system remains the same, with no further adjustment required.

The order of the signal processing is arranged, so that the various signal processing means can be configured in modular form. For example, the adjusting means can be configured as a standard module which is programmable to provide any quantity of adjustment which may be required. Additionally, the user can elect to eliminate certain of the higher level processing modules in order to save on costs, yet still have a signal format which he/she can utilize.

The present invention, therefore, provides an encoding system capable of providing non-power of two, even counts wherein the system is easily, and with minimal cost, modifiable to provide any number of different system counts, as well as a number of different levels of signal processing.

It is, therefore, an object of the present invention to provide an encoder system which provides unambiguous, non-power of two, even counts.

It is another object of the present invention to provide an encoder system in which the signal processing is arranged in modular form so that the user can be provided with a system output signal which has undergone a selectable amount of signal processing.

It is still another object of the present invention to provide an encoder system with signal processing arranged in modular form such that the system count can be modified by changing the processing in a minimal number of modules.

It is a further object of the present invention to provide an encoder system in which unambiguous, non-power of two, even counts are provided using a maximum of standardized signal processing modules and in which a minimum amount of modification is required to obtain different system counts.

The foregoing and other objectives, features and advantages of the invention will be more readily understood upon consideration of the following detailed description of certain preferred embodiments of the invention, taken in conjunction with the accompanying drawings.

DETAILED DESCRIPTION OF THE INVENTION

Figure 1:
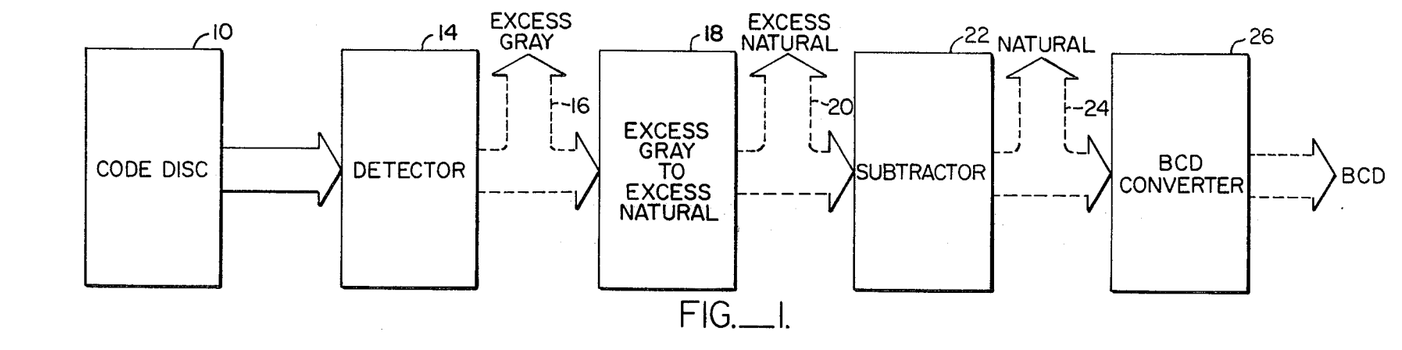
FIG. 1 is a generalized block diagram of the functional arrangement of the present invention.

Referring to FIG. 1, the division of system processing functions will be discussed. As can be seen from the figure, signal processing is divided into four functional areas or levels: (1) Detection circuitry 14 for converting the track combination on the code member into an excess gray code format 16; (2) excess gray to excess natural conversion circuitry 18 for an excess natural format 20; (3) excess natural to natural conversion circuitry 22 for a natural format 24; and (4) natural to binary-coded decimal conversion circuitry 26.

Figure 2:
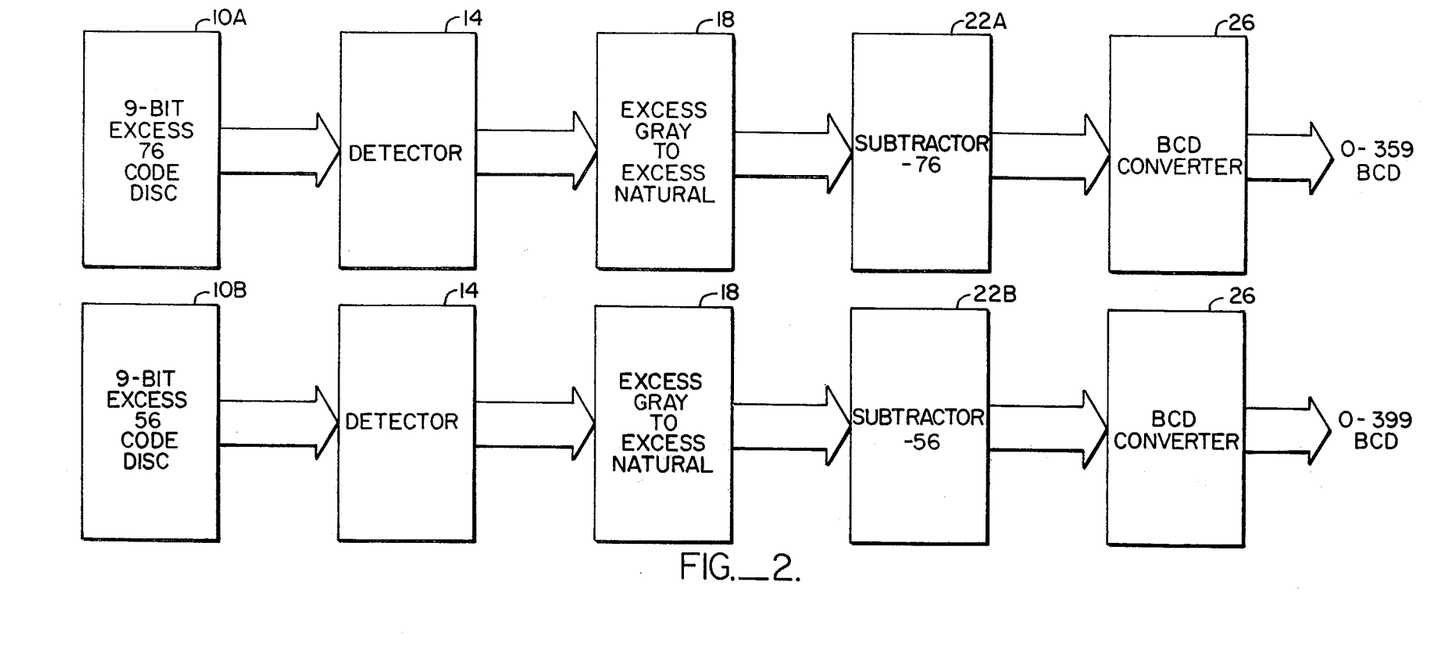
FIG. 2 is a simplified block diagram which illustrates the manner in which the present invention can be modified to provide a different system count.

From FIG. 2, it can be seen that by simply modifying the excess natural to natural conversion circuit 22 and the code member 10, a different system count can be obtained. For example, if zero to 359 count were desired, the code member 10A would contain a 9 bit excess 76 code and the excess natural to natural conversion circuitry 22A would subtract the quantity 76 from the excess natural code words supplied to it. Conversely, if a 400 count system were desired, the code member 10B would contain a 9 bit excess 56 track combination and the excess natural to natural conversion circuitry 22B would subtract the quantity 56. The other modules would remain unchanged. From FIGS. 1 and 2, it can also be seen that if the user desired a system output different from a binary-coded decimal format, appropriate modules could be deleted to supply a natural binary format, an excess natural binary format, or an excess gray code format.

The present invention is particularly suited for physical implementation, as described in a pending application for Positional Encoders With Plug-Together Modules, Ser. No. 216,069, the inventor of which is one of the co-inventors of the present invention.

In the present invention, a symmetric, unit step code is used, preferably a reflected gray code. The unit step property of the code provides the unambiguous transitions between code words. The symmetric property permits the full code complement, i.e., all of the possible code words in the code sequence, to be truncated equally at both ends without the loss of the unit step property between the end and beginning of the truncated sequence.

Figure 3:
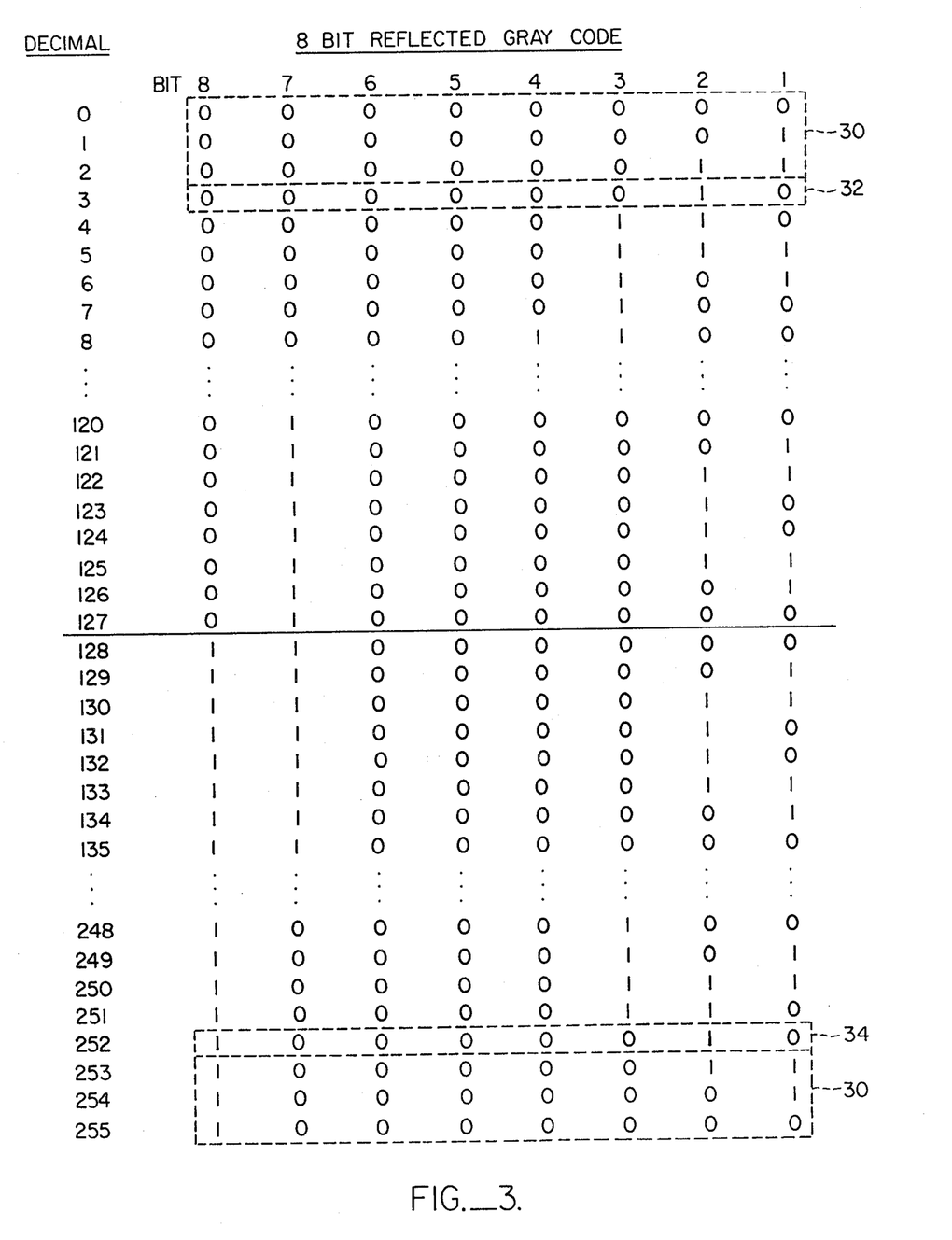
FIG. 3 is an illustration of the manner in which a truncated, symmetric, unit step code sequence is formed.

The operation of the system of the present invention can be better understood upon consideration of the manner in which the truncated code is formed. FIG. 3 illustrates the formation of the excess gray code sequence which is provided on the code member 10. In the example illustrated by FIG. 3, an eight-bit reflected gray code is utilized to provide a 250 count sequence. The full code complement for an eight-bit gray code contains 256 code words, i.e., $2^8 = 256$. It will be noted that, with the exception of the most significant bit (MSB), the code is symmetric with respect to its midpoint, between code words 127 and 128. Therefore, if an equal number of code words are deleted from the beginning and from the end of the code sequence, the first and the last code words would be identical, with the exception of the MSB. Therefore, the transition from the last word in the truncated sequence to the first word in the truncated sequence contains a transition in one bit only, in this case the MSB. In general, any number of words can be eliminated from the full complement of the code sequence, to provide the system count desired, so long as an equal number are deleted from the beginning and from the end of the sequence. For the purposes of the present invention, any code sequence which provides a unit step transition between code words and which provides the symmetric, or reflected property is suitable.

More specifically, in order to implement any even system count between 128 and 256, for example, an eight-bit reflected gray code can be used. By deleting the words indicated by bracket 30, a 250 word count can be obtained. It should be noted that the transition between the word denoted by reference numeral 32 and the word denoted by reference numeral 34 adheres to the unit step transition rule. A code sequence is thereby provided which has a non-power of two, unambiguous, even count of 250. Similarly, if a 200 word count were desired, 28 words would be removed from the beginning of the sequence and 28 words would be removed from the end of the sequence. The above sequences are excess sequences because each word of the code sequence has an apparent value in excess of its true value. For example, in the 250 count sequence the first word of the sequence has an apparent value of three and a true value of 0.

In the present invention, a sequence of code words is therefore provided on the code member 10 to supply the desired count such that a particular position of the code member 10 is represented by a code word which can be unambiguously distinquished from the code words corresponding to positions adjacent to the position under consideration. This feature will be true for every code word provided by the code member.

In the preferred embodiment of the present invention, the code member 10 comprises a disc mounted for rotation which is, typically, attached to a shaft, the position of which is desired to be known. Code discs of this sort are well-known in the art. For example, a typical code disc may be of the digital type, made of transparent material, such as glass, and provided with a pluraity of concentric circular tracks, each of which has successive segments or divisions which are alternately light and dark, so that incident light is modulated by the track when the disc is rotated. The arrangement of the light and dark segments or divisions of these concentric tracks with respect to each other provide the code words which correspond to the various positions of the shaft. For example, if a 250 count resolution were required, eight tracks would be provided, with each track having varying light and dark segments. There will be 250 regions on the code member defined by arcs of equal angle. Each region includes a segment of each of the eight tracks which, in combination, provide a code word from the code sequence, the code word uniquely identifies the disc position, and hence the shaft positions with which the region is associated.

In the preferred embodiment, these light and dark segments associated with each position of the code member 10 are read by a photo-optic arrangement, wherein photosensitive devices are disposed along a radial line extending from the center of the code disc, so that each track has disposed above it a photosensitive device. On the opposite side of the code member, a light source provides illumination which is modulated by the light and dark segments of the tracks so as to produce a corresponding light/dark pattern for detection by the photosensitive devices. Typical detector circuitry 14 for processing the signals provided by the photosensitive devices are shown in FIG. 4.

Figure 4:
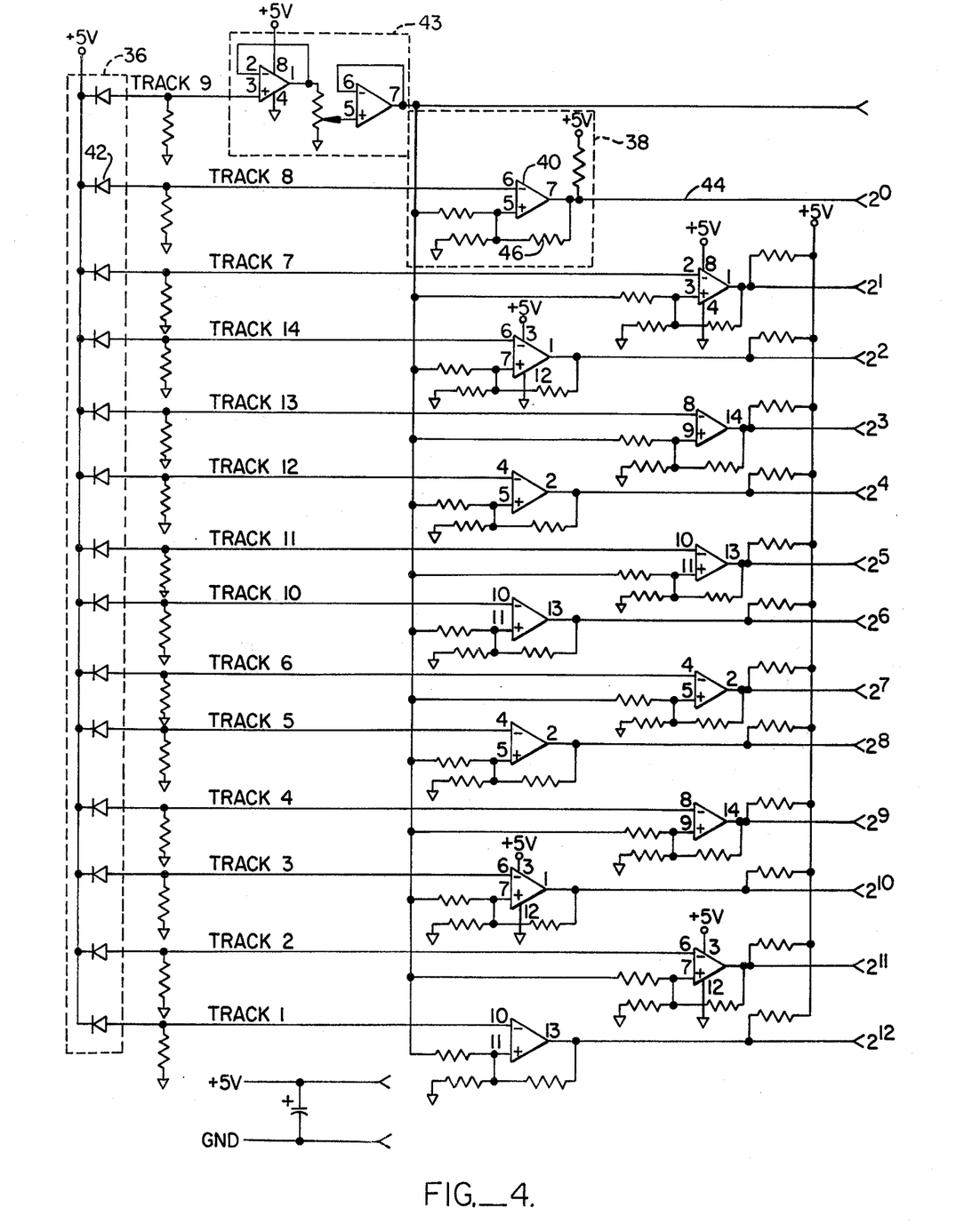
FIG. 4 is a schematic of typical circuitry by which the excess gray code word is derived from the code member.

In FIG. 4, the photosensitive devices are shown enclosed by dotted line 36 and comprise photodiodes 42. The outputs of the photodiodes are each supplied to comparator circuitry, of which the circuit enclosed by dotted line 38 is typical. The circuit within dotted line 38 comprises a voltage comparator 40, one input of which is supplied by photodiode 42 associated with track 8, and the other input of which is provided by the amplifier circuitry 43 which is associated with reference track 9.

The signal supplied through amplifier circuitry 43 is the reference against which comparator 40 compares the output of photodiode 42. When the output of photodiode 42 exceeds the reference level supplied by amplifier circuit 43, the voltage comparator 40 supplies a zero output level. On the other hand, when no signal is being supplied by photodiode device 42, the voltage comparator 40 supplies a positive output level. It should be noted that voltage comparator 40 is connected in a positive feedback mode through resistor 46 so that the transitions between zero and the positive level are sharply defined, thereby providing a digitized output waveform.

Amplifier 43 is supplied by a signal originating from track 9. Typically, track 9 is a transparent, concentric track disposed on the code disc, the purpose of which is to provide a reference illumination. In this manner, variations in the intensity of the light source are automatically compensated for in the comparator circuits.

In FIG. 4, there are 13 identical comparator circuits, each supplied with signals from identical photodiodes. The circuitry illustrated in FIG. 4 is capable of sensing and supplying signal waveforms corresponding to up to 13 tracks. Additional comparator circuits and photodiodes can be added to expand the total number of tracks which the circuit is capable of sensing, as desired.

Recalling that the plurality of tracks disposed on the code member 10 provide combinations of light and dark segments which correspond to an excess gray code, it will be noted that the electrical signals supplied by the outputs of the detector circuitry 14 in FIG. 4 will be in excess gray code format. The encoder system of the present invention is configured so that this signal output can be supplied directly to the user, or additional signal processing can be added.

Figure 5:
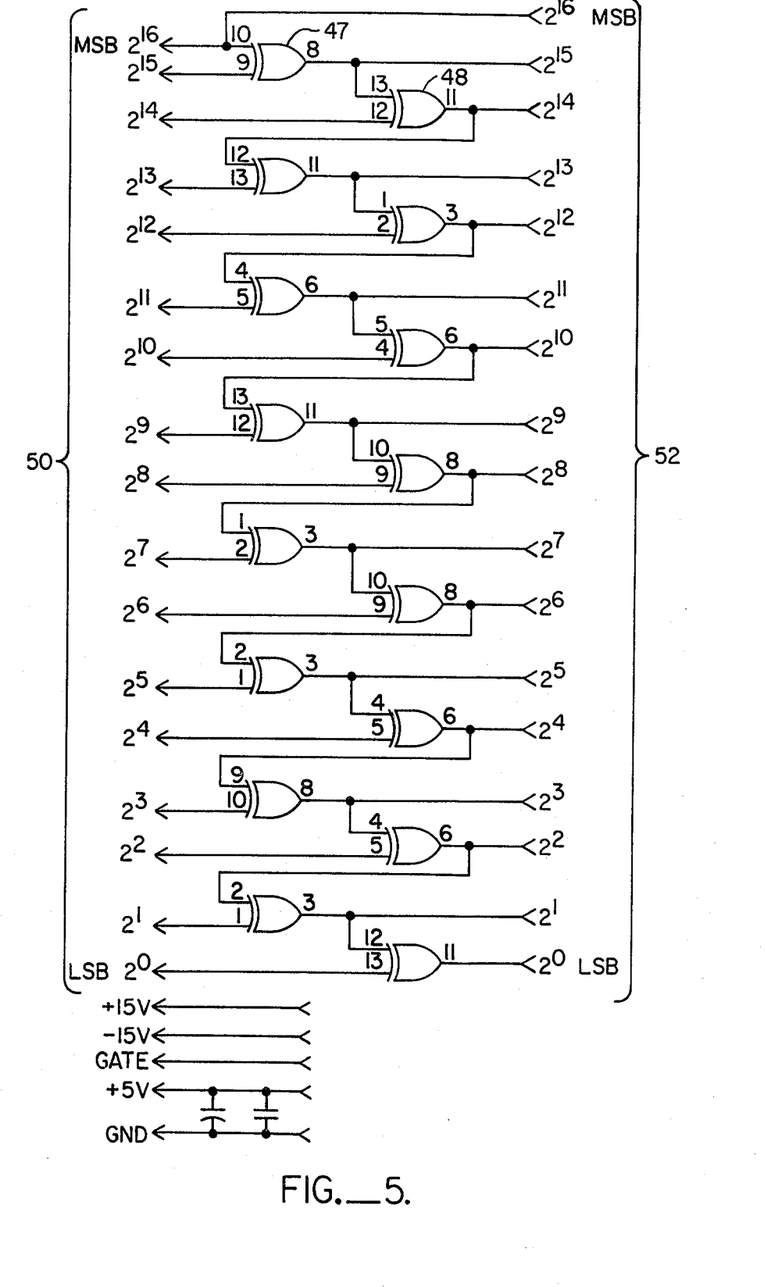
FIG. 5 is an illustration of typical circuitry by which the excess gray code word is converted into an excess natural binary word.

In the preferred embodiment of the present invention, the next level of processing is the excess gray to excess natural decoding circuitry 18. Typical circuitry for implementing such a function is illustrated in FIG. 5. This circuitry is a well-known gray code to natural binary converter. A plurality of exclusive OR gates are interconnected to provide the converting function. Typically, the most significant bit of gray code is used directly as the most significant bit of the natural binary word. The most significant bit ($2^n$), in this example $2^{16}$, of the gray code is also supplied to one input of XOR gate 47. The next significant bit ($2^{15}$) is provided to the other input to XOR gate 47. The output of XOR gate 47 supplies the next significant bit ($2^{15}$) of the natural binary word. The output of XOR gate 49 also supplies one input to XOR gate 48. The other input of XOR gate 48 is supplied by the gray code bit corresponding to $2^{14}$. The output of XOR gate 48 corresponds to the natural binary word bit $2^{14}$.

In general, the code bit corresponding to the natural binary word bit $2^n$ is derived by exclusive ORing the bit corresponding to gray code $2^n$ and the bit corresponding to natural binary word $2^{(n+1)}$. Thus, the remaining XOR gates shown in FIG. 5 are connected according to the above arrangement to decode the remaining bits in the gray code. FIG. 5 illustrates circuitry which is capable of decoding a 16-bit gray code.

The circuitry of FIG. 5 is capable of decoding any gray code, including reflected gray codes. Thus, when an excess, reflected gray code is applied to the inputs, indicated by bracket 50, of the converter circuitry 18, the resulting outputs, indicated by bracket 52, of the converter circuitry 18 will be in the form of an excess natural binary word. In the preferred embodiment of the present invention, this excess natural word 52, can be supplied directly to the user or can be further processed.

Figure 6:
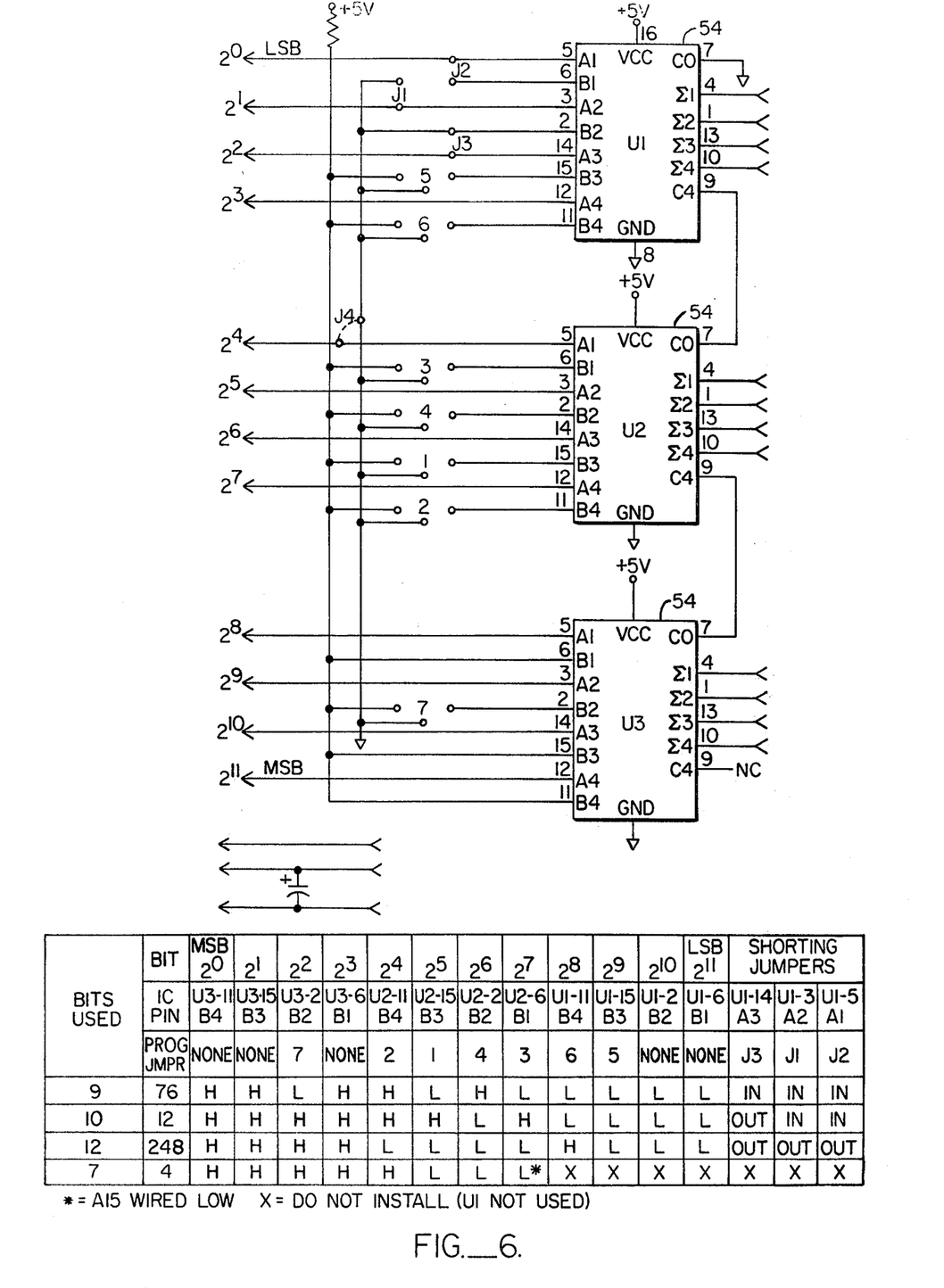
FIG. 6 is an illustration of typical circuitry by which the excess natural binary word is adjusted by a quantity corresponding to the number of words removed in forming the truncated, symmetric, unit step code sequence.

FIG. 6 illustrates circuitry 22 which converts the excess natural binary word supplied from circuitry in FIG. 5 into a natural binary word. The circuitry within FIG. 6 is a programmable subtractor for use with up to a 12-bit word. In this subtractor circuit, a 2's complement subtraction is utilized in conjunction with binary adders 54. The A inputs to each adder 54 are supplied by the excess natural binary word from the excess gray code to excess natural binary converter 18 in FIG. 5. The B inputs to adders 54 are each selectively connected at a one or a zero level depending upon the quantity sought to be subtracted. The program chart illustrates the connections required on the B input lines in order to subtract the required quantities to obtain the system counts shown. The ouputs of adders 54 provide a natural binary word format. This output word can either be used directly by the user or subjected to further processing.

Figure 7:
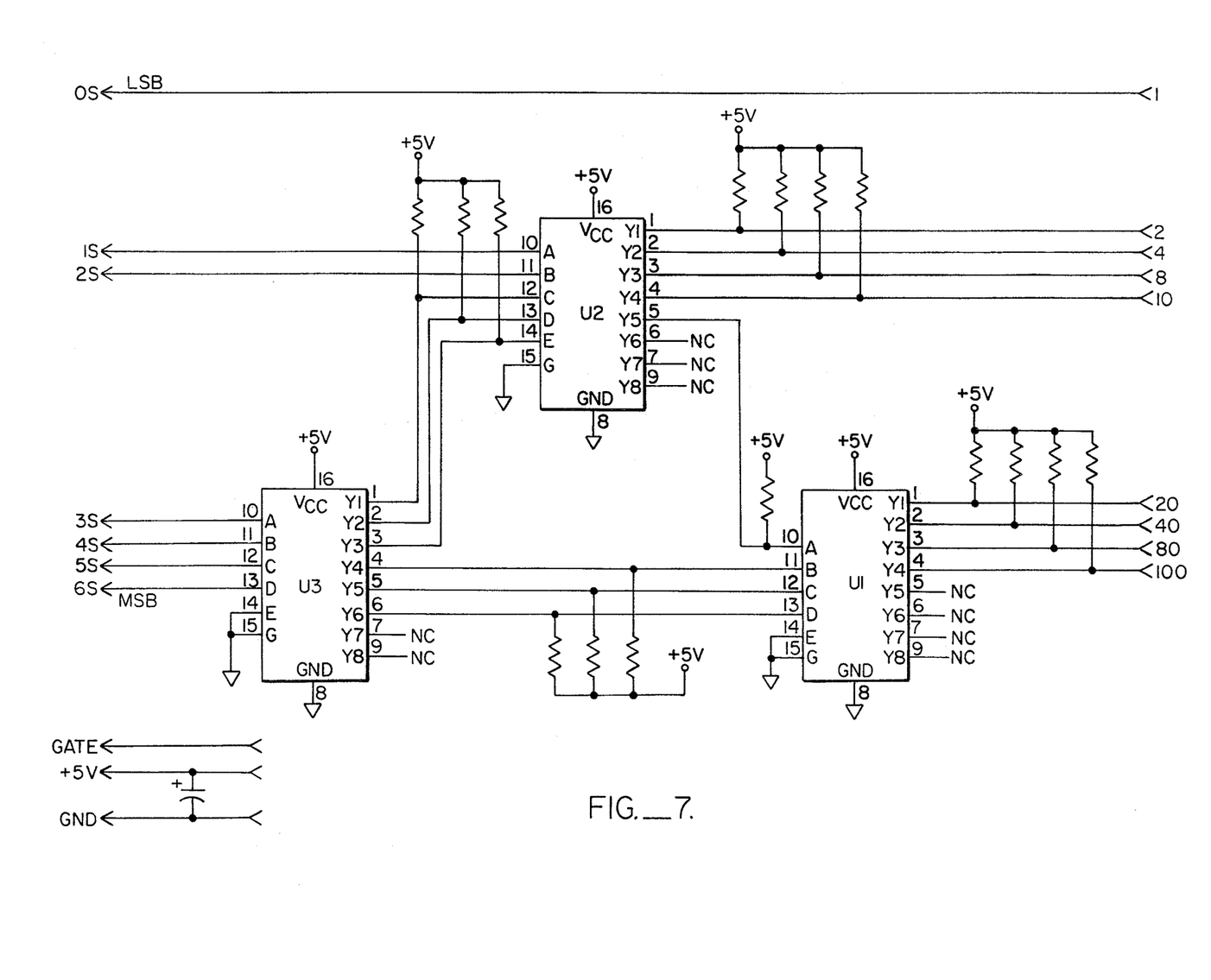
FIG. 7 illustrates typical circuitry for converting the natural binary word into a binary-coded decimal format, when a seven-bit natural binary word is present.
Figure 8:
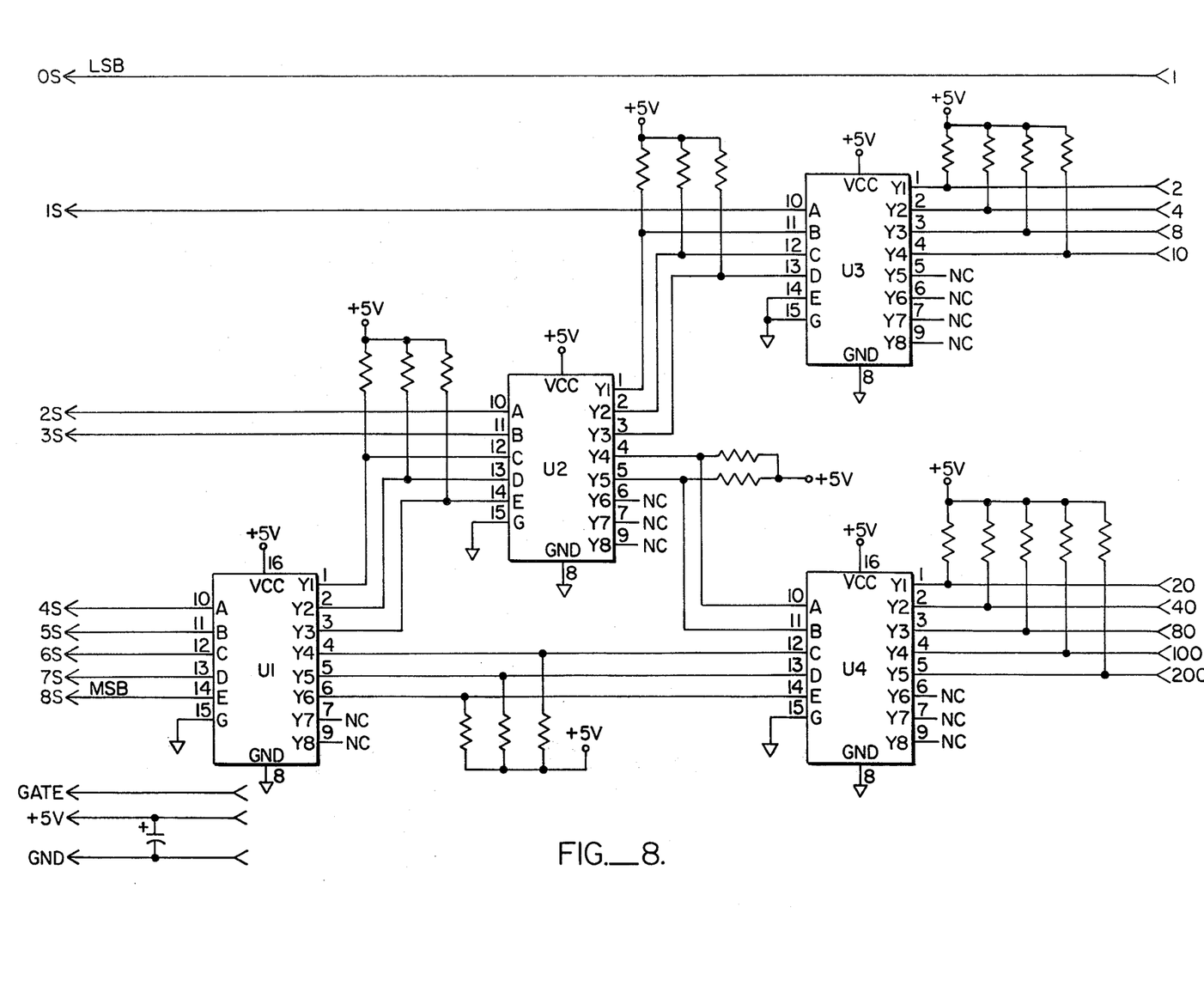
FIG. 8 illustrates a typical circuit for converting a nine-bit natural binary word to binary-coded decimal format.

FIGS. 7 and 8 illustrate the next level of processing, a natural to binary-coded decimal converter 26. FIG. 7 illustrates a seven-bit natural binary to binary-coded decimal (BCD) converter. FIG. 8 illustrates a nine-bit natural binary to BCD converter. The circuitry shown in FIGS. 7 and 8 are well-known in the art, and are constructed from readily available commercial integrated circuits. In the preferred embodiment of the present invention, the integrated circuits used are No. SN74185 types.

From the figures and the above discussion, it can be appreciated that the present invention provides a modular formated encoder system which is capable of supplying unambiguous, non-power of two, even counts in a variety of different output formats, and with a minimum of customized circuit requirements. The modular format into which the system processing functions are partitioned permits a majority of the processing circuitry for the system to comprise standardized modules which can accommodate a wide range of system counts. The modular configuration also permits the amount of signal processing to be easily increased or reduced depending upon the requirements of the user. This, in turn, permits a system which can be reduced in cost, depending upon the amount of processing that the user is willing to supply on his/her own.

For example, the most basic system configuration would comprise a code member 10 and detector circuit 14 and would supply an excess gray code. The user would supply his/her own electronics for excess gray code conversion. The basic system configuration requires the least amount of space. The next system level adds the excess gray to excess natural converter 18. This allows the user to interface with a microprocessor, for example, without using the processor for gray code to natural code conversion. If the subtractor circuit 22 were next added, the system output would be in natural binary form. The user could then supply a BCD converter and a digital display for visual display of the positional data, or interface with a computer for system level processing. The full system adds the BCD converter circuit 26 to provide a BCD output format. The user need only supply a digital display for immediate use of the system.

Figure 9:
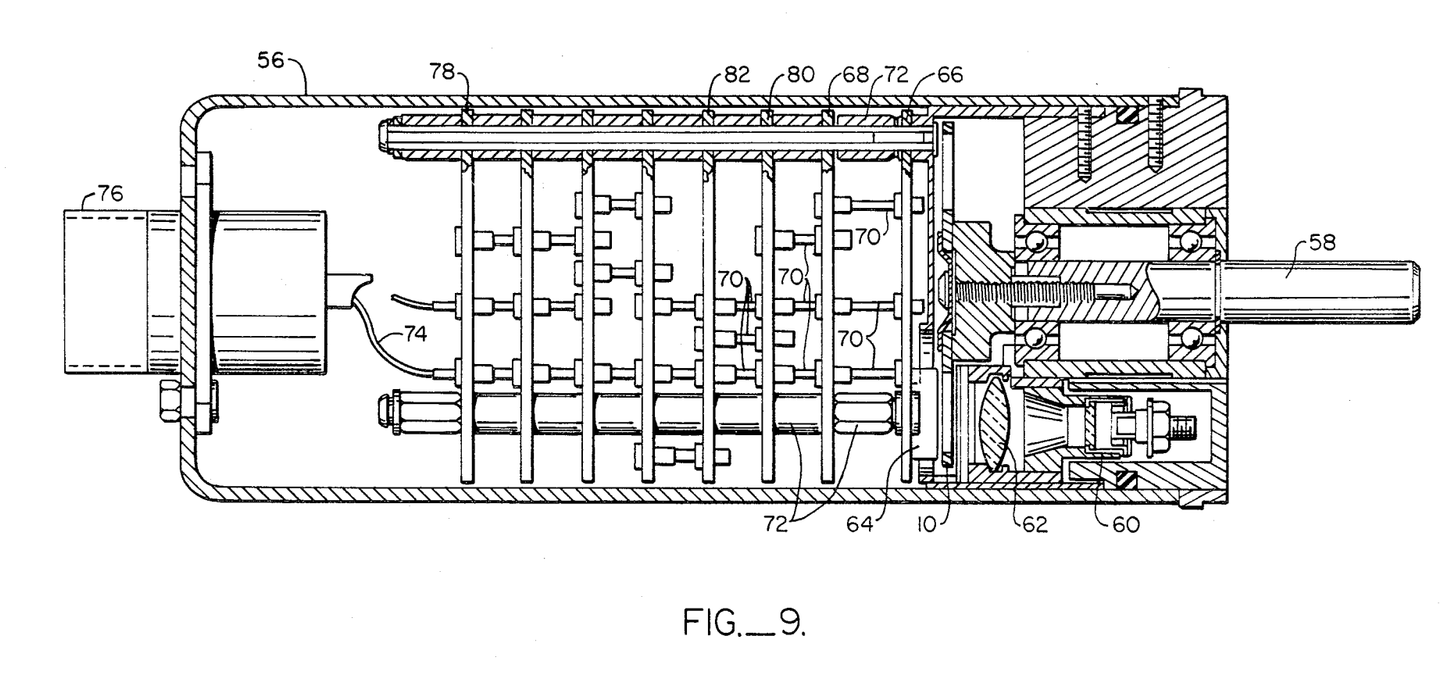
FIG. 9 illustrates the manner in which the various signal processing modules can be arranged in a stacked relationship with one another in the system.

Additionally, because of this modular format, the present invention is particularly suited for physical implementation as described in the above-mentioned patent application for Positional Encoders with Plug-Together Modules and illustrated in FIG. 9. In such a physical configuration, the circuitry for each level of signal processing can be packaged in separate physical modules. Each module can then be associated with a particular level of signal processing. The amount of signal processing supplied by the system can thus be affected by adding or removing appropriate modules in the processing chain. The modules can easily be connected and disconnected from the system, thereby making modifications to the system to provide different system counts or to change the amount of signal processing extremely simple. For example, the subtractor circuit 22 can be placed in a separate module so that only the subtractor module need be touched when a system count change is made.

If further buffering is desired, buffer circuitry can be added as additional modules disposed between the various stages of processing, or between the last level of processing and the system output. Rotational count and direction control can be added as an output stage after either the excess gray to excess natural circuit 18, the excess natural to natural circuit 22, or the natural to BCD circuit 26.

The present invention in the above stacked, modular physical implementation and as illustrated in FIG. 9 will be further described. The encoder system is contained within a housing 56. Code disc 10 is shown mounted to and for rotation with rotating member 58, for which position indication is desired. Light source 60 is focused by lens 62 onto code disc 10 so that the concentric tracks located on the code disc 10 can modulate the impinging light. Photodiode array 64 contains the photo diodes 42, each of which is aligned above an associated track to receive the modulated light from each track. Photo diode array 64 is shown mounted to module 66. Module 66 also contains the detector circuitry for deriving the excess gray code sequence from disc 10.

If, as discussed above, the user desires to supply his/her own electronics for processing the excess gray code signal, the system would be complete at this point with the addition of power supply board 78. Power supply board 78 receives power through output connector 76 and several signal lines in bundle 74. Supply voltages from power supply board 78 are distributed to the various modules in the module stack through commonly linked pins not shown. It can be seen from FIG. 9, that the height requirement for such a system is very small, thereby providing an encoder which can be accommodated in very small spaces.

If additional processing is desired, the next level of signal processing is provided by connecting module 68, which houses excess gray code to excess natural binary format conversion circuitry 18. Module 68 is shown connected to module 66 through pins 70 and spacers 72.

The next level of signal processing is provided by module 80 which contains programmable subtractor circuitry 22 for converting excess natural binary words to natural binary word formats.

The binary coded decimal conversion circuit 26 is contained within module 82 which is shown disposed above module 80. As before, module 82 is connected to module 80 through pins 70.

Additional modules are shown connected within the module stack to illustrate the ease with which further processing can be provided in the encoder system.

In general, in the configuration illustrated in FIG. 9, modules can be easily removed, serviced and reinserted; and signals can be fed straight through a module or processed by a module, depending upon the pin 70 interconnections chosen. In order to change the system count of the encoder shown in FIG. 9, the track configuration on disc 10 and the programming of subtractor circuitry in module 80 will be changed. The remaining portions of the encoder remain untouched.

Because of the manner in which the levels of signal processing of the present invention have been divided, the manner in which the system counts are encoded on the code disc, and because of the use of a truncated, symmetric, unit step code sequence, an encoder system which provides non-power of two, even counts can be implemented without the need for customized circuitry, scrambling or descrambling of code words, and which still retains an unambiguous system count output. While much discussion herein has been directed to the modularity feature of the present invention, it is to be understood that whether or not the system of the present invention is physically configured in modular form, the same low-cost, high flexibility features are present.

The encoder system provided by the present invention, therefore, offers great flexibility, at low cost, with a minimum of customized circuitry and a maximum of standardized parts. The system of the present invention finds utility in any application where an unambiguous, non-power of two, even count is desired. Such applications include English to Metric conversions, number of degrees to number of degrees times ten conversions, one-third degrees conversions, one-half degrees conversions, and numerous others.

In operation, in order to modify the system count, the code member 10 would be changed to provide the truncated, symmetric, unit step code sequence having the desired number of counts. Additionally, the subtractor module 22 would be reprogrammed to subtract a quantity corresponding to the one half of the total number of words removed from the full complement of the symmetric, unit step code sequence used to form the sequence provided on the code disc 10. Typically, when a count falls within a range having a high end represented by $2^n$, where n equals the total number of tracks on the code disc 10, and when the detector circuit 14, excess gray to excess natural circuit 18, and natural to BCD circuit 26 are implemented to handle code words up to n bits in length, only the code disc 10 and the subtractor circuit 22 need be changed. If a count requires a number of tracks exceeding the bit length which the above modules are capable of processing, then the modules should be adjusted upwards accordingly.

The terms and expressions which have been employed here are used as terms of description and not of limitation, and there is no intention, in the use of such terms and expressions of excluding equivalents of the features shown and described, or portions thereof, it being recognized that various modifications are possible within the scope of the invention claimed.

What is claimed is:

1. An encoder system for providing unambiguous, non-power-of-two, even counts corresponding to the angular position of a rotating member, comprising
    code means, which are mounted for rotation with the rotating member, for providing an excess code word which is indicative of the position of the rotating member, the excess code word corresponding to one of a plurality of positions of the rotating member, each position having associated with it a unique excess code word, wherein the totality of the excess code words provided by the code means provides a single, truncated, symmetric unit-step-code sequence, the number of words of which corresponds to the system count, the truncated sequence having the form of a full complement, symmetric, unit step sequence the beginning and end of which have been truncated by an equal number of code words; and
    means responsive to the excess code word for converting the excess code word into an excess natural word format which is suitable as a system output, as well as readily subjected to further signal processing.

2. The encoder as recited in claim 1 further including means responsive to the excess natural words for adjusting each excess natural word by a quantity equal to one-half of the number of words which were removed from the full complement symmetric code sequence in forming the truncated sequence, so that the adjusted excess natural word is in a natural-binary format.

3. The encoder as recited in claim 2 further including means responsive to the natural-binary words for transforming the natural-binary words into binary coded decimal format.

4. The encoder as recited in claims 1 or 2 or 3 wherein the code means comprise
    a code member having a multiplicity of concentric tracks, each track having varying light and dark segments for modulating light, wherein the combination of the segment provided by the portion of each track which falls within an associated predetermined arc segment forms the excess code word for the code means position;

a light source for providing illumination which is modulated by the segments of the concentric tracks; and means for detecting the modulated illumination and for converting the detected modulation into the excess code word format.

5. The encoder as recited in claims 2 or 3 wherein the adjusting means subtracts from each excess-binary word a quantity equal to one-half of the number of words which were removed from the full symmetrical, unit-step code complement in forming the truncated code sequence.

6. The encoder as recited in claims 1 or 2 or 3 wherein the truncated code sequence is an excess, reflected gray code.

7. The encoder as recited in claim 6 wherein the converting means is a gray code to binary code converting circuit.

8. The encoder as recited in claims 3 wherein the code means, the decoding means, the adjusting means and the transforming means are each contained in a separate module, each module having sets of pins suitable for providing electrical interconnection between modules wherein certain of the pins for each module carry electrical signals which are common to all of the modules and the remaining pins carrying electrical signals which are common among several of the modules, so that the modules can be placed in stacked relationship to one another so that the mating of the pins of the various modules distributes the various electrical signals among the various modules, and further wherein each module can be easily inserted and removed from the module stack.

9. A modular encoder system for providing unambiguous, non-power-of-two, even counts corresponding to the angular position of a rotating member, comprising code means, mounted for rotation with the rotating member, for providing an excess code word which is indicative of the position of the rotating member, the code word corresponding to one of a plurality of rotating member positions, each position having associated with it a unique excess code word, wherein the totality of the excess code words supplied by the code means provides a truncated, symmetric, unit-step code sequence, the truncated sequence including a full complement symmetric, unit-step code sequence from which an equal number of words have been removed at beginning and end;

means responsive to the excess code words for converting the excess code words into excess natural formatted word;

means responsive to the excess-natural formatted word for adjusting the excess-natural word by a quantity equal to one-half of the total number of words which were removed from the full code complement to form the truncated sequence, to provide a natural binary formatted word;

means responsive to the natural binary formatted word for transforming the natural binary word into a binary coded decimal formatted word, wherein the excess code word, the excess natural word, the natural binary word and the binary coded decimal word are each suitable for use as a system count output, and further wherein the full system count can be modified by changing the number of words which are removed in forming the truncated code sequence and by adjusting the excess natural word by a corresponding amount in the adjusting means.

10. The encoder system as recited in claim 9, wherein the code means include a code member having a multiplicity of concentric tracks, each track having varying light and dark segments for modulating light, the combination of the segments from each track which fall within a predetermined segment of arc forming the excess code word; and means for detecting the segments of the various tracks for each predetermined segment of arc.

11. The encoder system, as recited in claim 10, wherein the detecting means, converting means, adjusting means, and transformation means each provide a level of signal processing and are each contained in a separate module, each module having sets of pins suitable for providing electrical and mechanical interconnection between modules, wherein certain of the pins for each module carry electrical signals which are common to all of the modules and the remaining pins carry electrical signals which are common among several of the modules, and furtherwherein the pins of a particular module are positioned for mating with pins of both the module which contains the prior level of signal processing circuitry and the module which contains the next level of signal processing so that the modules can be placed in a stacked relationship to one another, the various electrical signals thereby being distributed among the modules, and so that each module can be easily replaced or substituted in the module stack.

12. The encoder as recited in claim 9, wherein the adjusting means include a programmable subtraction circuit in which quantity is subtracted from the excess natural word to provide a natural binary formatted word, the quantity corresponding to one-half of the total number of words removed from the full complement, symmetric unit step code to form the truncated code.

13. The encoder as recited in claims 9 or 10, wherein the truncated code sequence is an excess, reflected gray code.

14. The encoder as recited in claim 13, wherein the converting means comprise a gray code to binary converting circuit.

15. The encoder as recited in claims 9 or 12, wherein the transforming means is a binary to binary-coded-decimal converter circuit.

16. The encoder as recited in claim 9, wherein the truncated code sequence is a 9 bit excess 76 reflected gray code and the quantity by which the excess natural word is adjusted equals 152 to provide a system count of 360.

17. The encoder as recited in claim 9, wherein the truncated code sequence is a 10 bit excess 12 reflected gray code and the quantity by which the excess natural word is adjusted equals 24 to provide a system count of 1000.

18. The encoder as recited in claim 10, wherein the detecting means comprise a light source positioned on one side of the code member for providing light for modulation by the segments of the tracks on the code member;

a plurality of photo-optic sensor means, each sensor means disposed above a track and on the opposite side of the code member, for receiving light which has been modulated by the tracks and for converting the received modulated light into an electrical signal having a digital format.

19. An encoder system for providing unambiguous, non-power-of-two system counts corresponding to the angular position of a rotating member, comprising a code member having a multiplicity of concentric tracks, each track having varying light and dark segments for modulating light, wherein each track segment which falls within a predetermined segment of arc forms in combination an excess code word, wherein each predetermined segment of arc corresponds to one of a plurality of positions of the rotating member, each position having a unique excess code word associated therewith, and furtherwherein the totality of excess code words supplied by the code member forms an excess reflected gray code sequence and corresponds to the system count, the excess sequence being formed by removing an equal number of code words from the beginning and the end of a full complement, reflected gray code;

photo-optic means for sensing the excess code words provided by the code member and for converting the excess code word into a digital format;

excess gray to excess natural conversion means responsive to the digital formatted excess code word for providing an excess natural formatted word;

means responsive to the excess natural word for subtracting a quantity equal to one-half of the total number of code steps which were removed to form the excess reflected gray code, to provide a natural binary formatted word; and binary to binary-coded-decimal means for transforming the natural binary word into a binary-coded-decimal formatted word; and wherein the photo-optic means, the conversion means, the subtraction means and the transforming means are each provided in modular form, each module having associated therewith a set of pins, the pins for each module positioned to provide mechanical support and electrical interconnection between the modules so that the modules can be placed in a stacked relationship with one another and so that any particular module can be easily replaced or substituted; and further, wherein the excess gray code word, the excess natural word, the natural binary word and the binary-coded-decimal word are each suitable as a system count output.

20. An encoder system for providing unambiguous, non-power-of-two system counts corresponding to the angular position of a rotating member, comprising code means having an excess reflected gray code sequence for providing an indication of the position of the rotating member and a plurality of signal processing modules for processing the position indication, wherein the total number of words in the excess code sequence corresponds to the full system count, each code word being associated with a unique position of the rotating member, the code word associated with a particular position being the position indication for the position, the excess code including a full complement reflected gray code from which an equal number of words have been removed from the beginning and the end; and furtherwherein each signal processing module performs a different designated level of signal processing upon the position indication, the output from each module being suitable as a system output, so that any number of signal processing modules can be connected together in a processing progression to provide as the system output position indication signals which have been subjected to the selected amount of processing.

21. The encoder as recited in claim 20, wherein the code means provide an excess gray code formatted position indication, and furtherwherein the plurality of signal processing modules include a first signal processing module which is responsive to the excess gray code position indication for converting the excess gray code position indication into an excess natural formatted word.

22. The encoder as recited in claim 21, wherein the plurality of signal processing modules further include a second signal processing module which is responsive to the excess natural word for adjusting the excess natural word into a natural binary formatted word.

23. The encoder as recited in claim 22, wherein the plurality of signal processing modules further include a third signal processing module which is responsive to the natural binary formatted word for transforming the natural binary formatted word into a binary-coded-decimal formatted word.

24. The encoder as recited in claims 22 or 23, wherein the second signal processing module comprises a programmable subtraction circuit for reducing the value of the excess natural word by a quantity equal to one-half of the total number of code steps which were removed from the full complement reflected gray code in forming the excess reflected gray code sequence.

25. The encoder as recited in claim 4 wherein the truncated code sequence is an excess, reflected gray code.

26. The encoder as recited in claim 5 wherein the truncated code sequence is an excess, reflected gray code.

27. The encoder as recited in claim 6 wherein the converting means is a gray code to binary code converting circuit, and further wherein the code means, the decoding means, the adjusting means and the transforming means are each contained in a separate module, each module having sets of pins suitable for providing electrical interconnection between modules wherein certain of the pins for each module carry electrical signals which are common to all of the modules and the remaining pins carrying electrical signals which are common among several of the modules, so that the modules can be placed in stacked relationships to one another so that the mating of the pins of the various modules distributes the various electrical signals among the various modules, and further wherein each module can easily be inserted and removed from the module stack.

28. The encoder as recited in claim 25 wherein the converting means is a gray code to binary code converting circuit and further wherein the code means, the decoding means, the adjusting means and the transforming means are each contained in a separate module, each module having sets of pins suitable for providing electrical interconnection between modules wherein certain of the pins for each module carry electrical signals which are common to all of the modules and the remaining pins carrying electrical signals which are common among several of the modules, so that the modules can be placed in stacked relationships to one another so that the mating of the pins of the various modules distributes the various electrical signals among the various modules, and further wherein each module can easily be inserted and removed from the module stack.

29. The encoder as recited in claim 26 wherein the converting means is a gray code to binary code converting circuit and further wherein the code means, the decoding means, the adjusting means and the transforming means are each contained in a separate module, each module having sets of pins suitable for providing electrical interconnection between modules wherein certain of the pins for each module carry electrical signals which are common to all of the modules and the remaining pins carrying electrical signals which are common among several of the modules, so that the modules can be placed in stacked relationships to one another so that the mating of the pins of the various modules distributes the various electrical signals among the various modules, and further wherein each module can easily be inserted and removed from the module stack.

* * * * *